United States Patent
Zhou et al.

(10) Patent No.: US 10,669,449 B2
(45) Date of Patent: *Jun. 2, 2020

(54) COMPOSITE ABRASIVE PARTICLES FOR CHEMICAL MECHANICAL PLANARIZATION COMPOSITION AND METHOD OF USE THEREOF

(71) Applicant: Versum Materials US, LLC, Tempe, AZ (US)

(72) Inventors: Hongjun Zhou, Tempe, AZ (US); Jo-Ann Theresa Schwartz, Kennett Square, PA (US); Malcolm Grief, Tempe, AZ (US); Xiaobo Shi, Tempe, AZ (US); Krishna P. Murella, Tempe, AZ (US); Steven Charles Winchester, Tempe, AZ (US); John Edward Quincy Hughes, Tempe, AZ (US); Mark Leonard O'Neill, Tempe, AZ (US); Andrew J. Dodd, Tempe, AZ (US); Dnyanesh Chandrakant Tamboli, Tempe, AZ (US); Reinaldo Mario Machado, Tempe, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/125,724

(22) Filed: Sep. 9, 2018

(65) Prior Publication Data

US 2020/0115590 A1    Apr. 16, 2020

Related U.S. Application Data

(62) Division of application No. 14/993,128, filed on Jan. 12, 2016, now Pat. No. 10,109,493.

(60) Provisional application No. 62/102,319, filed on Jan. 12, 2015, provisional application No. 62/221,379, filed on Sep. 21, 2015.

(51) Int. Cl.
| | |
|---|---|
| B24B 37/24 | (2012.01) |
| C09G 1/02 | (2006.01) |
| C09K 3/14 | (2006.01) |
| H01L 21/308 | (2006.01) |
| H01L 21/3105 | (2006.01) |
| H01L 21/306 | (2006.01) |

(52) U.S. Cl.
CPC ............. *C09G 1/02* (2013.01); *C09K 3/1436* (2013.01); *C09K 3/1445* (2013.01); *H01L 21/30625* (2013.01); *H01L 21/31053* (2013.01); *B24B 37/24* (2013.01)

(58) Field of Classification Search
None
See application file for complete search history.

(56) References Cited

U.S. PATENT DOCUMENTS

| | | | | |
|---|---|---|---|---|
| 10,109,493 B2 * | 10/2018 | Zhou | ............ | C09G 1/02 |
| 2016/0200944 A1 * | 7/2016 | Zhou | ............ | C09G 1/02 |
| | | | | 438/693 |
| 2017/0133236 A1 * | 5/2017 | Murella | ............ | C09G 1/02 |

* cited by examiner

*Primary Examiner* — Stephanie P Duclair
(74) *Attorney, Agent, or Firm* — Lina Yang

(57) ABSTRACT

Chemical Mechanical Planarization (CMP) polishing compositions comprising composite particles, such as ceria coated silica particles, offer low dishing, low defects, and high removal rate for polishing oxide films. Chemical Mechanical Planarization (CMP) polishing compositions have shown excellent performance using soft polishing pad.

21 Claims, 10 Drawing Sheets

COMPOSITE ABRASIVE PARTICLES FOR CHEMICAL MECHANICAL PLANARIZATION COMPOSITION AND METHOD OF USE THEREOF

CROSS REFERENCE TO RELATED APPLICATIONS

This application is a divisional application of U.S. application Ser. No. 14/993,128 filed on Jan. 12, 2016 which claims priority to U.S. provisional applications 62/102,319 filed on Jan. 12, 2015, and 62/221,379 filed on Sep. 21, 2015, the entire contents of which is incorporated herein by reference thereto for all allowable purposes.

BACKGROUND OF THE INVENTION

The present invention relates to chemical mechanical planarization ("CMP") polishing compositions (CMP slurries, CMP composition or CMP formulations are used interchangeably) used in the production of a semiconductor device, and polishing methods for carrying out chemical mechanical planarization. In particular, it relates to polishing compositions comprising composite abrasive particles that are suitably used for polishing patterned semiconductor wafers that composed of oxide materials.

Silicon oxide is widely used as dielectric materials in semiconductor industry. There are several CMP steps in integrated circuit (IC) manufacturing process, such as shallow trench isolation (STI), inter-layer dielectric (ILD) CMP and gate poly CMP etc. Typical oxide CMP slurry involves: abrasive, with or without other chemicals. Other chemicals could be dispersants to improve slurry stability, booster to increase removal rate, or inhibitors to decrease removal rate and to stop on the other film, for example, SiN for STI application.

Among common abrasives used in CMP slurries, such as silica, alumina, zirconia, titania and so on, ceria is well-known for its high reactivity toward silica oxide and is widely used in STI CMP slurry for the highest oxide removal rate (RR) due to the high reactivity of ceria to silica.

Cook et al. (Lee M. Cook, Journal of Non-Crystalline Solids 120 (1990) 152-171) proposed a 'chemical tooth' mechanism to explain this extraordinary property of ceria. According to this mechanism, when ceria particles are pressed onto silicon oxide film, ceria breaks down silica bonds, forms a Ce—O—Si structure and thus cleavage silica from the surface.

Most of the ceria used in CMP industry are manufactured from calcinations-wet milling process. The resulted ceria has sharp edges and very wide size distribution. It also has very large "large particle count" (LPC). All of these are believed to be responsible for defects and low yields, especially scratch after the wafer is polished. This is confirmed from IC fabs that are suffering from defects with ceria based slurries.

Besides calcined ceria, some particle companies have commercial products with colloidal ceria. Colloidal ceria is made from ceria precursor in aqueous system. Compared to calcined ceria (top-down process), colloidal ceria is bottom up process. Colloidal ceria has a much narrower size distribution and better controlled shapes. However, due to the crystal growth habit in aqueous system, colloidal ceria still has sharp edges. LPC of colloidal ceria is comparable to that of calcined ceria.

As the semiconductor technology advances to smaller feature sizes, the specifications on allowable size and number of defects on post-polish also become more challenging. Defects typically comprise scratches, slurry residues and residual film residues. The properties of polishing pads critically affect polishing results during chemical mechanical polishing (CMP) of integrated circuit substrates. One of the critical parameters of the CMP pads that defines the performance is pad hardness or elasticity. It is known that softer pads cause reduced scratches on surface (e.g. Hsein et al. Microelectronic Engineering, vol 92, 2012, pp 19-23). It will therefore be highly beneficial to use softer pads to reduce scratch defects in critical CMP processes such as shallow trench isolation. However, it is known that softer pads result in lower removal rates (e.g. Castillo-Mejia et al., Journal of Electrochemical Society, Vol. 150 (2), 2003, pp G76-G82). Also it is known that softer pads have an undesirable impact on post-polish topography of patterned wafers (e.g. L. Wu, Journal of Electrochemical Society, Vol. 153 (7), 2006, pp. G669-G676). Because of these limitations of soft pads, STI CMP process is carried out on harder CMP pads such as IC1000 or IC1010. Compensating for lower removal rates on soft pads by increasing abrasive particle loading would lead high defectivity. As a result, for critical applications such as STI, it is very challenging to achieve a combination of high removal rates, low defectivity and low topography on soft pad.

Therefore, there are significant needs for CMP compositions, methods, and systems that can offer higher removal rate (especially on soft polishing pad); low dishing and low defects.

BRIEF SUMMARY OF THE INVENTION

Described herein are oxide material CMP polishing compositions, methods and systems that satisfy the need.

In one embodiment, described herein is a polishing composition comprising:

composite particles comprising core particles with surfaces covered by nanoparticles;

an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;

a pH-adjusting agent selected from the group consisting of sodium hydroxide, potassium hydroxide, cesium hydroxide, ammonium hydroxide, quaternary organic ammonium hydroxide (e.g. tetramethylammonium hydroxide), and combinations thereof;

and the remaining being water;

wherein change of size distribution of composite particles under a disintegrative force is less than 10%;

the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and the polishing composition has a pH of about 2 to about 12; preferably about 4 to about 10; more preferably from about 4.5 to about 7.5.

In a further embodiment, described herein is a polishing method for chemical mechanical planarization of a semiconductor substrate comprising at least one surface having at least one oxide layer, comprising the steps of:
a) contacting the at least one oxide layer with a polishing pad;
b) delivering a polishing composition to the surface, the polishing composition comprising:
    composite particles comprising core particles with surfaces covered by nanoparticles;
    an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof;
    arylamines, aminoalcohols, aliphatic amines, heterocyclic amines, hydroxamic acids, substituted phenols, sulfonamides, thiols, polyols having hydroxyl groups, and combinations thereof;
    a pH-adjusting agent selected from the group consisting of sodium hydroxide, potassium hydroxide, cesium hydroxide, ammonium hydroxide, quaternary organic ammonium hydroxide (e.g. tetramethylammonium hydroxide), and combinations thereof;
    and
    the remaining being water;
    wherein
        change of size distribution of composite particles under a disintegrative force is less than 10%;
        the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and
        the polishing composition has a pH of 2 to about 12; preferably about 4 to about 10; more preferably from about 4.5 to 7.5;
and
c) polishing the at least one oxide layer with the polishing composition.

In yet another embodiment, described herein is a system for chemical mechanical planarization, comprising:
a semiconductor substrate comprising at least one surface having at least one oxide layer;
a polishing pad; and
a polishing composition comprising:
    composite particles comprising core particles with surfaces covered by nanoparticles;
    an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
    a pH-adjusting agent selected from the group consisting of sodium hydroxide, potassium hydroxide, cesium hydroxide, ammonium hydroxide, quaternary organic ammonium hydroxide (e.g. tetramethylammonium hydroxide), and combinations thereof;
    and
    the remaining being water;
    wherein
        change of size distribution of composite particles under a disintegrative force is less than 10%;
        the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and
        the polishing composition has a pH of about 2 to 12; preferably about 4 to 10; more preferably from about 4.5 to 7.5;
wherein at least one oxide layer is in contact with the polishing pad and the polishing composition.

In yet another embodiment, described herein is a system for chemical mechanical planarization, comprising:
a semiconductor substrate comprising at least one surface having at least one oxide layer;
a soft polishing pad; and
a polishing composition comprising:
    composite particles comprising core particles with surfaces covered by nanoparticles;
    an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
    a pH-adjusting agent selected from the group consisting of sodium hydroxide, potassium hydroxide, cesium hydroxide, ammonium hydroxide, quaternary organic ammonium hydroxide (e.g. tetramethylammonium hydroxide), and combinations thereof;
    and
    the remaining being water;
    wherein
        the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and
        the polishing composition has a pH of about 2 to 12; preferably about 4 to 10; more preferably from about 4.5 to 7.5;

wherein at least one oxide layer is in contact with the polishing pad and the polishing composition.

The polishing composition can further comprise a surfactant and/or biological growth inhibitors.

Surfactants can be selected from the group consisting of a). non-ionic surface wetting agents; b). anionic surface wetting agents; c). cationic surface wetting agents; d). ampholytic surface wetting agents; and mixtures thereof.

The biological growth inhibitors include, but are not limited to, tetramethylammonium chloride, tetraethylammonium chloride, tetrapropylammonium chloride, alkylbenzyldimethylammonium chloride and alkylbenzyldimethylammonium hydroxide, wherein the alkyl chain ranges from 1 to about 20 carbon atoms, sodium chlorite, sodium hypochlorite, and combinations thereof.

DETAILED DESCRIPTION OF THE INVENTION

Figure 1:
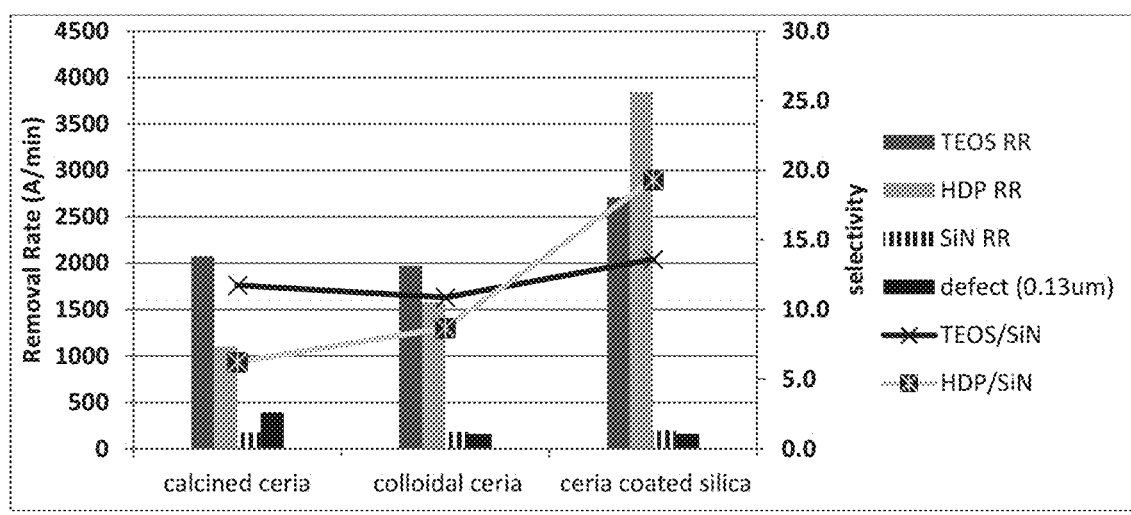
FIG. 1 shows the polishing results from slurries having different particles.

CMP compositions (or CMP slurries, or CMP formulations), methods, and systems disclosed in this invention can offer higher removal rate (especially on soft polishing pad); low dishing and low defects.

Each of the composite abrasive particles has a core particle and many nanoparticles covering the surface of the core particle. The core particle is selected from the group consisting of silica, alumina, titania, zirconia, and polymer particle. The nanoparticles are selected from the group consisting of oxides of zirconium, titanium, iron, manganese, zinc, cerium, yttrium, calcium, magnesium, fluorine, lanthanum and strontium nanoparticles.

The amount of nanoparticles covering the surface of the core particles preferably falls within the following range in terms of the solid weight ratio. The solid weight (b) of the nanoparticles relative to the solid weight (a) of the core particles is (b)/(a)=0.01 to 1.5, preferably 0.01 to 1.2.

One of the examples of the composite particles is to have silica as the core particles and ceria as the nanoparticles; and each silica core particle has ceria nanoparticles covering its shell. The surface of each silica particle is covered by ceria nanoparticles. The silica base particles are amorphous; and the ceria nanoparticles are singly crystalline.

Diameter of the ceria nanoparticles covering the core particle is preferably greater than 10 nm, preferably more than 13 nm. Having larger ceria particle diameter would allow higher removal rate to be possible.

Core particle size may range from 10 nm to 500 nm, preferably between 20 nm to 200 nm, most preferably between 50 nm and 150 nm.

Another aspect of the present invention, involves use of ceria coated silica particles that do not disintegrate under polishing forces. It is hypothesized that if the particles do not breakdown under the action of polishing forces (i.e. disintegrative forces) and keep the characteristic of original particle size, then the removal rate would remain high. If the particles on the other hand disintegrate under polishing forces, the removal rate would decrease owing to effectively smaller abrasive particle size. Breaking of the particles may also yield irregular shaped particles which may have undesirable effect on scratching defects. Particle stability under disintegrative forces can also be determined by subjecting the formulation to the ultrasonication treatment for half an hour and measuring the changes in size distribution. Preferred conditions for ultrasonication treatment are ½ hour immersion in bath with 42 KHZ frequency at 100 W output. Particle size distribution can be measured by using any suitable technique such as Disc Centrifuge (DC) method or Dynamic Light Scattering (DLS). Changes in size distribution can be characterized in terms of changes in mean particle size or D50 (50% particles below this size) or D99 (99% particles below this size) or any similar parameters. Preferably the changes in particle size distribution of ceria coated silica particles after ultrasonication treatment is less than 10%, more preferably less than 5% or most preferably less than 2%; by using for example DC and mean particle size, D50, D75 and/or D99. Using such stable particles in CMP slurry formulations would allow more effective utilization of polishing forces for film material removal and would also prevent generation of any irregular shapes that would contribute to scratching defects In another aspect of the present invention, the silica-based composite particle having an amorphous oxide layer including at least one type of element among aluminum, zirconium, titanium, iron, manganese, zinc, cerium, yttrium, calcium, magnesium, fluorine, lanthanum silicon, and strontium on the surface of an amorphous silica particle A, and a crystalline oxide layer B including at least one type of element selected from among zirconium, titanium, iron, manganese, zinc, cerium, yttrium, calcium, magnesium, fluorine, lanthanum and strontium thereupon.

Since advanced CMP applications require extremely low levels of metals such as sodium on the dielectric surface after polishing, it is desired to have very low trace metals, especially sodium in the slurry formulations. In certain preferred embodiments the formulations comprise ceria coated silica particles that have less than 5 ppm, more preferably less than 1 ppm most preferably less than 0.5 ppm of sodium impurity levels for each percent of particles in the formulations by weight.

The composite particles are used as abrasive in the CMP compositions, formulations or slurries ("CMP composition", "CMP formulation", or CMP slurry" are used interchangeably). An example is STI (Shallow Trench Isolation) CMP formulations, to polish oxide films, such as various metal oxide films; and various nitride films. In STI formulations, the formulations comprising silica coated ceria composite particles can provide very high removal rates of silicon oxide films and very low removal rates of silicon nitride polish stop films. These slurry formulations can be used to polish a variety of films and materials including but not limited to thermal oxide, Tetra Ethyl Ortho Silicate (TEOS), High Density Plasma (HDP) oxide, High Aspect Ratio Process (HARP) films, fluorinated oxide films, doped oxide films, organosilicate glass (OSG) low-K dielectric films, Spin-On Glass (SOG), polymer films, flowable Chemical Vapor Deposited (CVD) films, optical glass, display glass. These formulations can be used in stop-in-film applications, where the polishing is stopped once the topography is removed and a flat surface is achieved. Alternatively these formulations can be used in applications that involve polishing the bulk film and stopping at a stopper layer. These formulations can be used in a variety of applications including Shallow Trench Isolation (STI), Inter Layer Dielectric (ILD) polish, Inter Metal Dielectric (IMD) polish, through silicon via (TSV) polish. These formulations may also be used in any other applications such as glass polishing or solar wafer processing or wafer grinding where high removal rates are desired.

The CMP composition comprises composite particles, a pH adjusting agent that is used to adjust pH of the CMP composition to the optimized pH condition; a suitable chemical additive to enhance/suppress the removal rate of polish stop layer/film; and the remaining being water.

The abrasive is present in an amount from 0.01 wt % to 20 wt %, preferably, from 0.05 wt % to 5 wt %, more preferably, from about 0.1 wt % to about 1 wt %.

Chemical additive includes, but is not limited to a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof.

The amount of chemical additive ranges from about 0.1 ppm to 0.5 wt % relative to the total weight of the barrier CMP composition. The preferred range is from about 200 ppm to 0.3% and more preferred range is from about 500 ppm to 0.15 wt %.

The pH-adjusting agent includes, but is not limited to, sodium hydroxide, cesium hydroxide, potassium hydroxide, cesium hydroxide, ammonium hydroxide, quaternary organic ammonium hydroxide (e.g. tetramethylammonium hydroxide) and mixtures thereof.

The amount of pH-adjusting agent ranges from about 0.0001 wt % to about 5 wt % relative to the total weight of the CMP composition. The preferred range is from about 0.0005% to about 1 wt %, and more preferred range is from about 0.0005 wt % to about 0.5 wt %

The pH of the CMP composition ranges from about 2 to about 12. The preferred range is about 4 to about 10. The most preferred range is from about 4.5 to 7.5.

The CMP composition may comprise a surfactant.

The surfactant includes, but is not limited to, a). Non-ionic surface wetting agents; b). Anionic surface wetting agents; c). Cationic surface wetting agents; d). ampholytic surface wetting agents; and mixtures thereof.

The non-ionic surface wetting agents include, but are not limited to, oxygen- or nitrogen-containing compounds with various hydrophobic and hydrophilic moieties in the same molecules, the molecular weight ranges from several hundreds to over 1 million. The viscosities of these materials also possess a very broad distribution.

The anionic surface wetting agents are compounds that possess the negative net charge on major part of molecular frame. These compounds include, but are not limited to salts with suitable hydrophobic tails, such as alkyl carboxylate, alkyl polyacrylic salt, alkyl sulfate, alkyl phosphate, alkyl bicarboxylate, alkyl bisulfate, alkyl biphosphate, such as alkoxy carboxylate, alkoxy sulfate, alkoxy phosphate, alkoxy bicarboxylate, alkoxy bisulfate, alkoxy biphosphate, such as substituted aryl carboxylate, substituted aryl sulfate, substituted aryl phosphate, substituted aryl bicarboxylate, substituted aryl bisulfate, substituted aryl biphosphate etc. The counter ions for this type of surface wetting agents include, but are not limited to potassium, ammonium and other positive ions. The molecular weights of these anionic surface wetting agents range from several hundred to several hundred-thousands.

The cationic surface wetting agents possess the positive net charge on major part of molecular frame. These compounds include, but are not limited to salts with suitable hydrophobic tails, such as carboxylate, sulfate, phosphate, bicarboxylate, bisulfate, biphosphate, etc. The counter ions for this type of surface wetting agents include, but are not limited to potassium, ammonium and other positive ions. The molecular weights of these anionic surface wetting agents range from several hundred to several hundred-thousands.

The ampholytic surface wetting agents possess both positive and negative charges on the main molecular chains and with their relative counter ions. Examples of such bipolar surface wetting agents include, but are not limited to salts of amino-carboxylic acids, amino-phosphoric acid, amino-sulfonic acid, and mixtures thereof.

Examples of surfactants also include, but are not limited to, dodecyl sulfate sodium salt, sodium lauryl sulfate, dodecyl sulfate ammonium salt, secondary alkane sulfonates, alcohol ethoxylate, acetylenic surfactant, and any combination thereof. Examples of suitable commercially available surfactants include TRITON™, Tergitol™, DOWFAX™ family of surfactants manufactured by Dow Chemicals and various surfactants in SUIRFYNOL™, DYNOL™, Zetasperse™, Nonidet™, and Tomadol™ surfactant families, manufactured by Air Products and Chemicals. Suitable surfactants of surfactants may also include polymers comprising ethylene oxide (EO) and propylene oxide (PO) groups. An example of EO-PO polymer is Tetronic™ 90R4 from BASF Chemicals.

Other surfactants that have functions of dispersing agents and/or wetting agents include, but are not limited to, polymeric compounds which may have anionic or cationic or nonionic or zwitterionic characteristics. Examples are polymers/copolymers containing functional groups such as acrylic acid, maleic acid, sulfonic acid, vinyl acid, ethylene oxide, etc.

The amount of surfactant ranges from about 0.0001 wt % to about 10 wt % relative to the total weight of the CMP composition. The preferred range is from about 0.001 wt % to about 1 wt %, and more preferred range is from about 0.005 wt % to about 0.1 wt %.

Formulations may also comprise water soluble polymers which may comprise anionic or cationic or non-ionic or combinations of groups.

The CMP composition may comprise biological growth inhibitors or preservatives to prevent bacterial and fungal growth during storage.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chloride, and sodium hypochlorite.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

Formulations of this invention are especially effective on softer pads with better removal rates, defects and planarity compared to formulations with different particles. CMP pads can be characterized for elasticity or hardness using a variety of techniques such as Shore hardness testing, dynamical mechanical analysis, ultrasonic characterization, compositional analysis to determine ratio of hard to soft polymer segments, etc. Shore D hardness testing measured as per the method described in ASTM D2240-1 0 ASTM standard is a well-known testing method for CMP pad hardness. Although there is no clear definition in literature demarking soft pad and hard pad, CMP pads such as IC1000 and IC1010 (Supplied by Dow Chemicals) which are generally considered hard pads have a Shore D hardness of 57. CMP pads characterized as soft such as Dow Ikonic 2000 series have Shore D hardness less than 45. Other examples of commercially available soft pads include Politex series pads from Dow Chemicals, EPIC D200 series pad from Cabot Microelectronics, Fujibo H7000N pads from Fujibo, Nexplanar 11 EG from Nexplanar, VP3500 pad from Dow Chemicals. While polishing on soft pads, the formulations of this invention comprising ceria coated silica particles provide at least 2 times, more preferably more than 5 times, and most preferably more than 10 times higher removal rates on TEOS films compared to similar formulation comprising calcined ceria particles with comparable mean particle size as measured by Disc Centrifuge technique.

Formulations of this invention are especially effective on softer pads with better removal rates, defects and planarity compared to formulations with different particles. CMP pads can be characterized for elasticity or hardness using a variety of techniques such as Shore hardness testing, dynamical mechanical analysis, ultrasonic characterization, compositional analysis to determine ratio of hard to soft polymer segments, etc. Shore D hardness testing measured as per the method described in ASTM D2240-1 0 ASTM standard is a well-known testing method for CMP pad hardness. Although there is no clear definition in literature demarking soft pad and hard pad, CMP pads such as IC1000 and IC1010 (Supplied by Dow Chemicals) which are generally considered hard pads have a Shore D hardness of 57. CMP pads characterized as soft such as Dow Ikonic 2000 series have Shore D hardness less than 45. Other examples of commercially available soft pads include Politex series pads from Dow Chemicals, EPIC D200 series pad from Cabot Microelectronics, Fujibo H7000N pads from Fujibo, Nexplanar 11 EG from Nexplanar, VP3500 pad from Dow Chemicals. While polishing on soft pads, the formulations of this invention comprising ceria coated silica particles provide at least 2 times, more preferably more than 5 times, and most preferably more than 10 times higher removal rates on TEOS films compared to similar formulation comprising calcined ceria particles with comparable mean particle size as measured by Disc Centrifuge technique. The removal rates of TEOS films while polishing at 2 psi downforce on a soft pad with a slurry formulation comprising 0.5 wt % abrasive particles would be higher than 500 Angstroms/min, more preferably more than 750 Angstroms/min or most preferably more than 1000 Angstroms/min.

Working Examples

Polishing Pad IC1010 pad, supplied by Dow Corporation; and soft Fujibo polishing pad supplied by Fujibo, were used for CMP process.

TEOS oxide films by Chemical Vapor Deposition (CVD) using tetraethylorthosilicate as the precursor HDP oxide films made by high density plasma (HDP) technique SiN films—Silicon nitride films Parameters:

Å: angstrom(s)—a unit of length

BP: back pressure, in psi units

CMP: chemical mechanical planarization=chemical mechanical polishing

CS: carrier speed

DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Selectivity

Removal Rate (RR)=(film thickness before polishing–film thickness after polishing)/polish time.

TEOS RR Measured TEOS removal rate at 2.0 psi (soft pad) and 4.7 psi (hard pad) down pressure of the CMP tool HDP RRMeasured HDP removal rate at 2.0 psi (soft pad) and 4.7 psi (hard pad) down pressure of the CMP tool SiN RR Measured SiN removal rate at 2.0 psi (soft pad) and 4.7 psi (hard pad) down pressure of the CMP tool Selectivity of TEOS/SiN=TEOS RR/SiN RR; HDP/SiN=HDP RR/SiN RR at same down force (psi)

All percentages are weight percentages unless otherwise indicated.

General Experimental Procedure

In the examples presented below, CMP experiments were run using the procedures and experimental conditions given below.

The CMP tool that was used in the examples is a Mirra®, manufactured by Applied Materials, 3050 Boweres Avenue, Santa Clara, Calif., 95054. A Fujibo H7000HN pad, supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Air Products Chemical Incorporation, at baseline conditions.

The oxide film thickness specifications are summarized below:

TEOS: 15,000 Å

HDP: 10,000 Å

Example 1

Ceria coated silica particles were composite particles that have silica as the core particle and ceria nanoparticles on the silica particle surface. LPC (Large particle Count) tells how many big particles in the slurry. As a widely accepted concept, scratch is normally caused by big particles. Usually, slurry with higher LPC gives worse performance on defects compared to slurry with lower LPC. LPCs are typically measured by optical techniques such as light obscuration or Single Particle Optical Sizing (SPOS).

Table 1 compared LPC of three different particle solutions using Accusizer™ 780 particle sizing system: a solution containing calcined ceria particles (Mean particle size by Disc Centrifuge: 97.9 nm), a solution containing colloidal ceria particles (HC90 obtained from Solvay), and a solution containing ceria coated silica composite particles (CPOP-20 from JGC C&C Ltd). CPOP-20 particles are made by the methods described in JP2013119131, JP2013133255, Japanese Patent Application No. JP2015-169967, and Japanese Patent Application No. JP2015-183942.

TABLE 1

LPC comparison of different particle solutions

| particles | LPC >= 0.51 μm (#/ml) | LPC >= 1 μm (#/ml) |
|---|---|---|
| Calcined ceria | 1.22E+10 | 9.64E+6 |
| Colloidal ceria | 1.62E+11 | 7.09E+08 |
| Ceria coated silica | 2.88E+08 | 9.50E+05 |

The solution containing ceria coated silica composite particles had the lowest LPC compared to the other two. This is highly desired for CMP applications, especially for advanced nodes where the yield is highly sensitive on defects.

Example 2

The CMP compositions comprised 0.5 wt % abrasive, 0.077 wt % ammonium polyacrylate (Molecular Weight 16000-18000), ammonium hydroxide, and water. The CMP compositions had a pH of 5.

All three CMP compositions had the same chemical constitutes, pH and abrasive wt %. The only difference in the three slurries was the type of abrasives being used. Three types of abrasive were conventional calcined ceria and colloidal ceria, and ceria coated silica (the composite particles). The oxide films polished were TEOS films, referring to the oxide film made by CVD (chemical vapor deposition) using TEOS (tetraethyl orthosilicate) as precursor; and HDP (high density plasma) films, referring to oxide films made by HDP technique.

The CMP compositions and IC1010 pad were used to polish the oxide films and SiN films.

CMP performance (removal rate-RR and defects) with different abrasive particles were compared and shown in FIG. 1. The ceria coated silica had highest RR on both TEOS and HDP oxide films. It also had the highest selectivity of oxide film over SiN and a lower defect (threshold at 0.13 μm).

Example 3

All CMP compositions had same chemical constitutes, but with different amount (wt %) of ceria coated silica abrasive. All CMP compositions had 0.077 wt % ammonium polyacrylate (Molecular Weight 16000-18000), ammonium hydroxide. The CMP compositions had a pH of 7.

The CMP compositions and 101010 pad were used to polish the oxide films.

Figure 2:
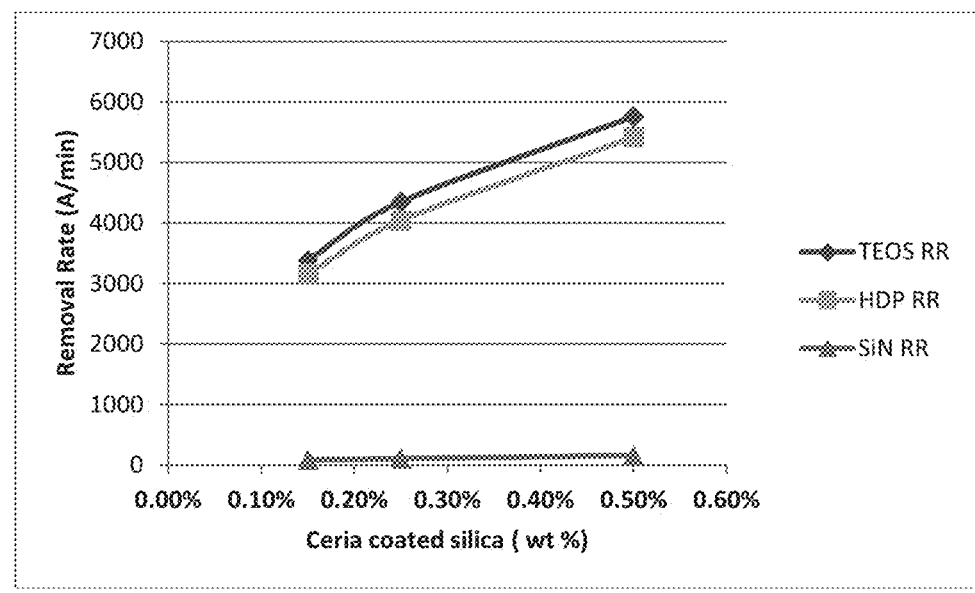
FIG. 2 shows the polishing results vs (ceria coated silica) solids % on the removal rate.

Effect of ceria coated silica abrasive wt % on RR was studied and shown in FIG. 2. When the amount (wt %) of ceria coated silica abrasive increased, both TEOS RR and HDP RR increased shown as the solids skew in FIG. 3. As a comparison, SiN RR stayed flat. When 0.5 wt % ceria coated silica abrasive was used, TEOS RR and HDP RR reached almost 6,000 Å/min. The result indicates the ceria coated silica particles are very efficient on oxide film removal.

Example 4

All CMP compositions had same chemical constitutes, but different amount (wt %) of ammonium polyacrylate (Molecular Weight 16000-18000). All CMP compositions comprised: 0.25 wt % of ceria coated silica as the abrasive, ammonium hydroxide. The CMP compositions had a pH of 5.

The CMP compositions and 101010 pad were used to polish the oxide films.

Figure 3:
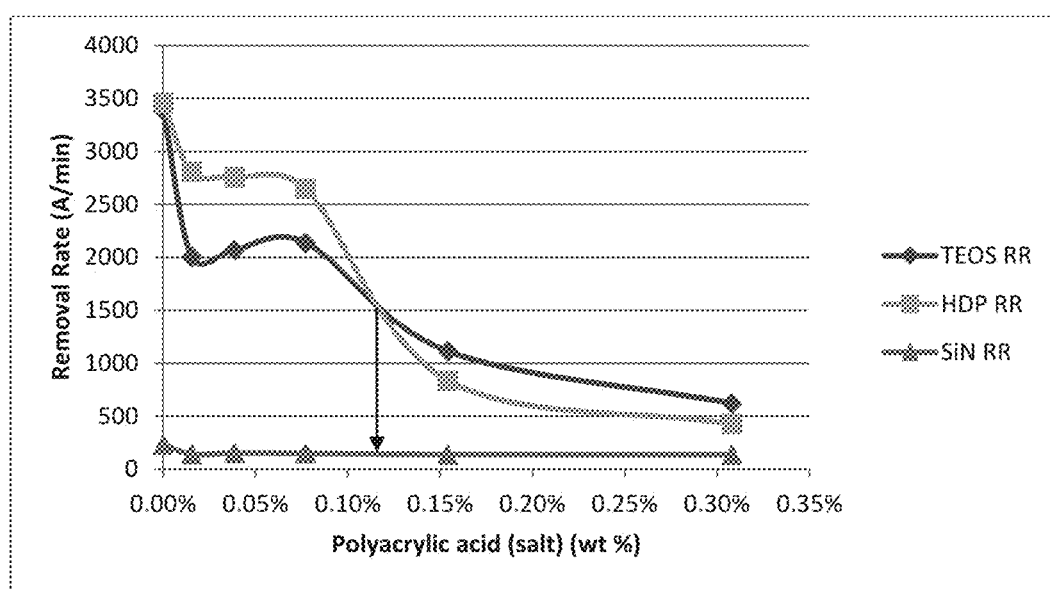
FIG. 3 shows the effect of polyacrylic acid (salt) on the polishing results (Remove Rate (RR) using IC1010 pad).

The effect of polyacrylate concentration on RR was shown in FIG. 3. As the polyacrylic acid (salt) concentration in the CMP compositions slurries increased from in the range of 0 to 0.30 wt %, RR of TEOS film and RR of HDP film changed significantly from 3500 Å/min. to ~500 Å/min. SiN RR changed very little in the range and reached a steady level once polyacrylic acid (salt) reached 0.1 wt %. The relative ratio of TEOS RR vs HDP RR also changed in the range. When little amount (0.13 wt %) of ammonium polyacrylate (Molecular Weight 16000-18000) was added, HDP RR was higher than TEOS RR. After polyacrylate concentration reached a certain level (e.g. ~0.13% in FIG. 3), TEOS RR turned to be higher than HDP RR. As comparison, similar test with wt % of polyacrylic acid (salt) vs RR with calcined ceria and colloidal ceria, HDP RR is always lower than TEOS RR at any wt % of polyacrylate.

Example 5

All CMP compositions comprised: 0.25 wt % of ceria coated silica as the abrasive, 0.077 wt % of ammonium polyacrylate (Molecular Weight 16000-18000), ammonium hydroxide. The CMP compositions had a pH of 5 or 7.

The CMP compositions and 101010 pad were used to polish the oxide films.

Figure 4:
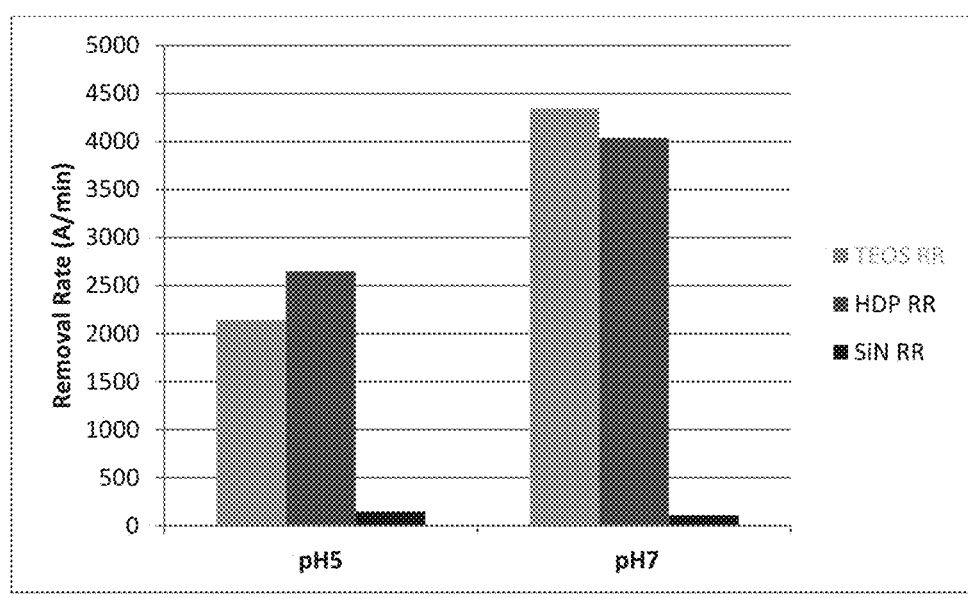
FIG. 4 shows effect of pH on the polishing results (RR using IC1010 pad).

The effect of different pH on RR was shown in FIG. 4. As pH increased from 5 to 7, TEOS RR and HDP RR also increased, while SiN RR decreased. Thus, changing pH to neutral would increase the oxide/SiN selectivity. At pH=5, HDP RR was higher than TEOS RR. However, the result was reversed at pH=7 where TEOS RR being higher than HDP RR.

Example 6

All CMP compositions comprised: 0.5 wt % of ceria coated silica as the abrasive, 0.077 wt % of ammonium polyacrylate (Molecular Weight 16000-18000), ammonium hydroxide. The CMP compositions had a pH of 5.

Figure 5:
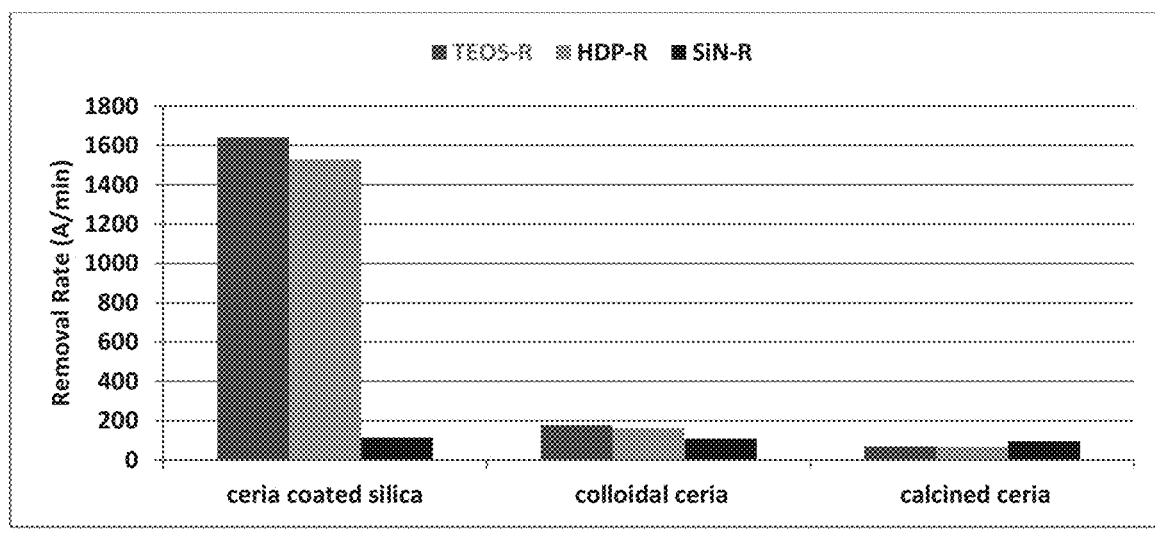
FIG. 5 shows the polishing performance comparison on soft pad (Fujibo pad).

The CMP compositions and a soft pad, e.g. Fujibo pad, were used to polish the oxide films. The results were shown in FIG. 5.

When the oxide films were polished with a soft pad, e.g. Fujibo pad, CMP compositions with colloidal ceria and calcined ceria had negligible removal rate. As a contrast, CMP compositions with ceria coated silica gave very high removal rates. This was a unique performance of the CMP composition comprising ceria coated silica composite particles.

Example 7

Three CMP Formulations A, B and C were made with different abrasive materials. All the formulations comprised 0.5 wt % abrasive particles, 0.077 wt % ammonium polyacrylate (Molecular Weight 16000-18000), with pH adjusted between 5 and 6.

Formulation A was made with calcined ceria particles (described in example 1), formulation B was made with HC-90 colloidal ceria particles obtained from Solvay Chemicals, and formulation C was made with CPOP-20 ceria coated silica particles.

Polishing with these slurries was carried out using different CMP pads, Hard Pad #1 (101000 from Dow Chemicals), Soft Pad #1 (Fujibo H7000 from Fujibo), Soft Pad #2 (VP3500 from Dow Chemicals), Soft Pad #3 (Nexplanar 11EG from Nexplanar). Polishing on the hard pad was performed with 4.7 psi downforce. Polishing on soft pad was performed with 2 psi.

Figure 6:
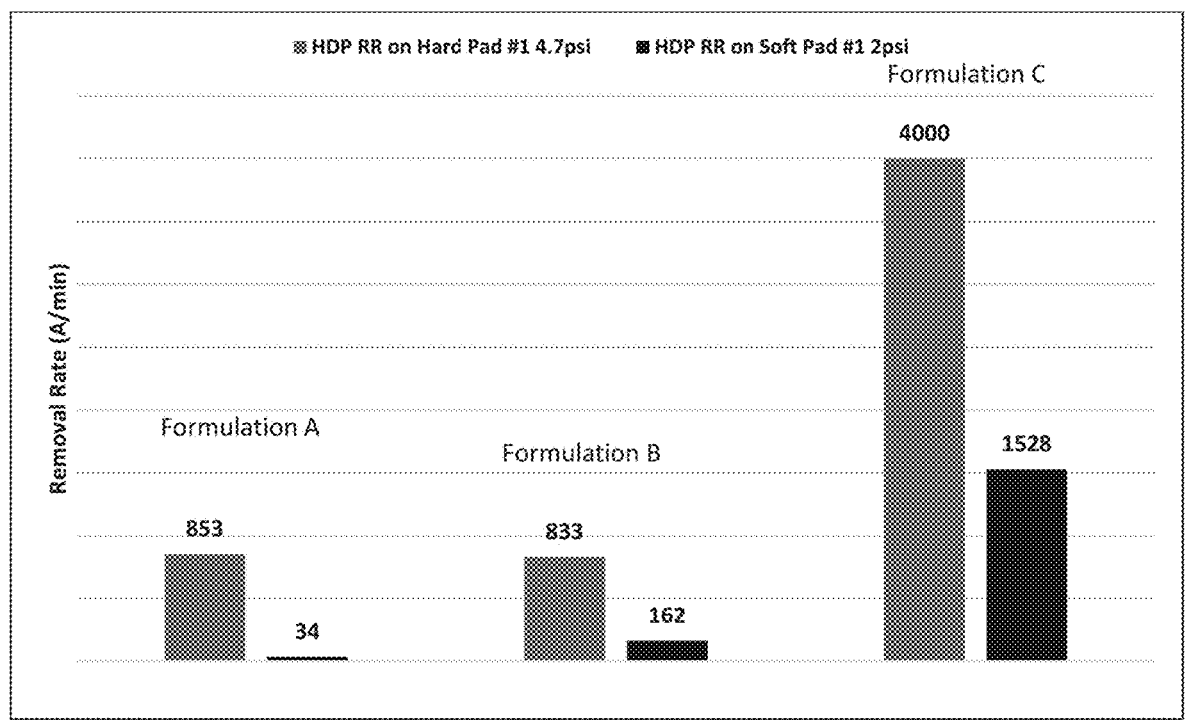
FIG. 6 shows TEOS removal rates from slurries having different abrasive particles on both hard pad and soft pad.

FIG. 6 showed that with ceria coated silica particles (Formulation C) very high TEOS removal rates were achieved on both hard pad and soft pad (#1). With calcined ceria (Formulation A) and colloidal ceria (Formulation B), the TEOS removal rates on soft pads were extremely low to be effective for CMP application. Ceria coated silica particles showed unexpectedly TEOS high rates on soft pad.

Figure 7:
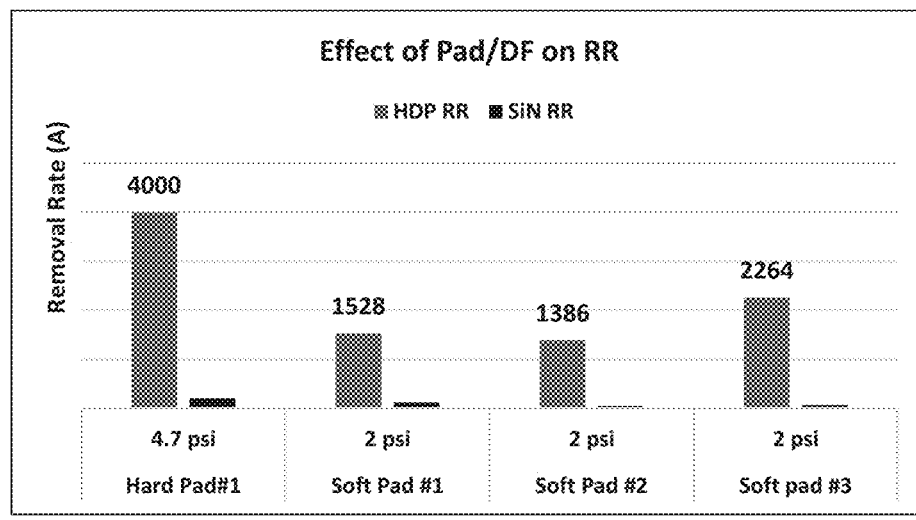
FIG. 7 shows TEOS removal rates on different pads using slurries containing ceria coated silica composite particles.

Data in FIG. 7 showed TEOS removal rates on different pads using Formulation C. High TEOS removal rates were achieved using all different types of pads.

Figure 8:
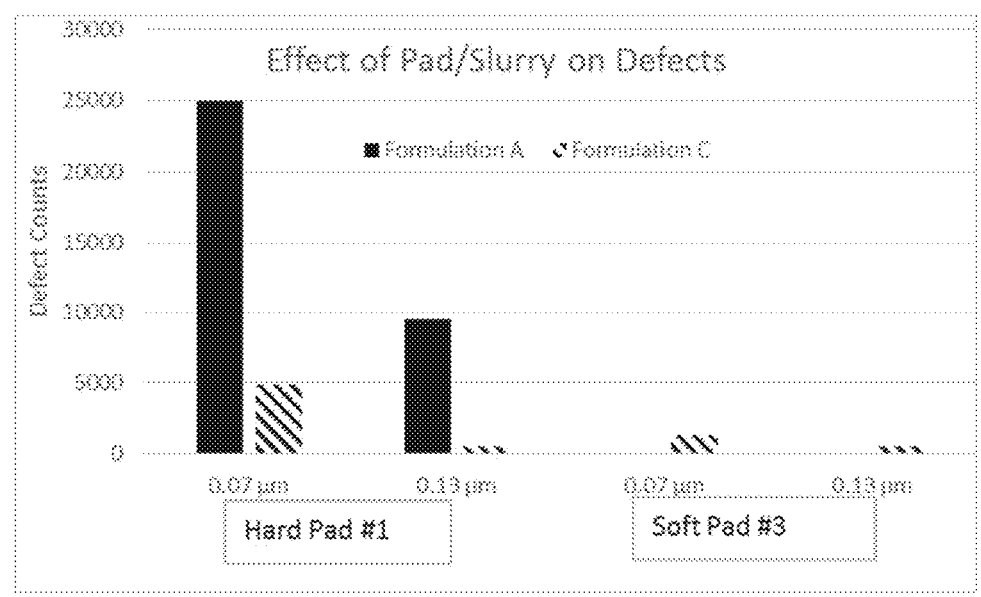
FIG. 8 shows number of defects on TEOS wafer after polishing with slurries having different abrasive particles on both hard pad and soft pad.

Number of defects on TEOS wafer after polishing with Formulations A and C using Hard Pad #1 and Soft Pad #3 were measured. The results were shown in FIG. 8. Wafers polished with Formulation A on Soft Pad 3 were not measured for defectivity because very small thickness of film removed.

Formulation C containing ceria coated silica particles had dramatic improvement in defects compared to Formulation A containing calcined ceria even on hard pad.

Defects were also much lower on soft pad compared to hard pad. Using ceria coated silica particles thus enables CMP applications which require polishing on soft pad to achieve both high removal rates and low defects.

Figure 9:
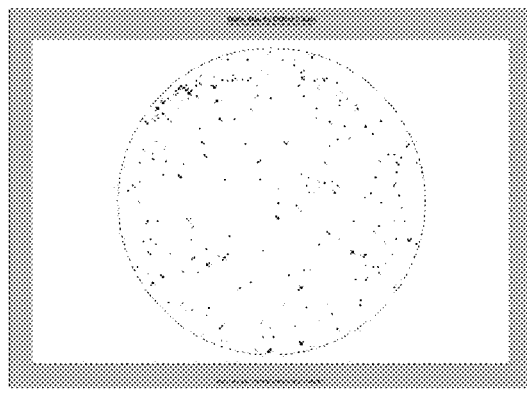
FIG. 9 shows number of defects on high aspect ratio process (HARP) films after polishing with slurries having different abrasive particles on IC1010 pad.
Figure 9:
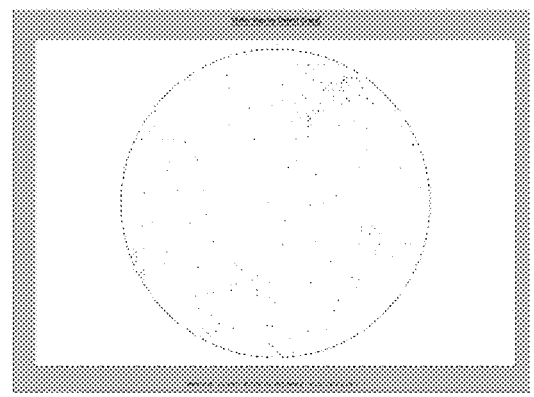

Number of defects on high aspect ratio process (HARP) films after polishing with Formulations A and C using 101010 pad were measured. The results were shown in FIG. 9. The defects using Formulation C containing ceria coated silica particles resulted in very low defects compared to the defects using Formulation A containing calcined ceria particles.

Figure 10:
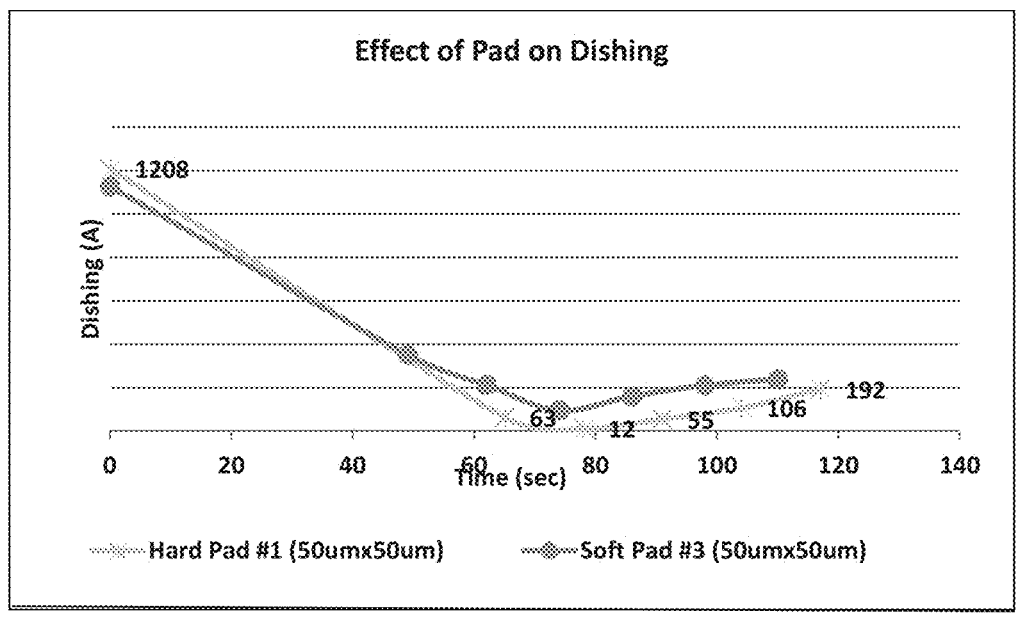
FIG. 10 shows the performance on patterned wafer using slurries containing ceria coated silica composite particles on both hard pad and soft pad.

Performance on patterned wafer with Formulation C was also measured using both hard pad (101010) and soft pad (#3). The results of dishing were shown in FIG. 10.

Topography on the wafers was measured on 50 micron lines at 50% pattern density at various polishing times. The results showed very low dishing topography on 50 micron lines using both soft and hard pads. Dishing is known to be much worse on soft pad compared to hard pad. Using ceria coated silica particles allowed low dishing even on soft pads.

Example 8

Three slurry formulations (D,E,F) comprising water, 0.5% abrasive particles, 0.077% ammonium polyacrylate (Molecular Weight 16000-18000), ammonium hydroxide to adjust pH to 5 were prepared with different abrasive particles.

Formulation D was made with ceria coated silica particles (Referred to as Particle CP2) that were prepared as per the method described in US 2012/0077419 for comparison. Mean Particle Size (MPS) measured by Disc Centrifuge Analysis was 41 nm. Formulation E was prepared using calcined ceria particles (Mean particle size measured by Disc Centrifuge Analysis: 97 nm) described in example 1. Formulation F was prepared using CPOP-20 ceria coated silica particles as described in example 1. Mean Particle Size (MPS) of these particles measured by Disc Centrifuge was 97.7 nm.

These slurry formulations were used to polish TEOS wafers on Bruker CP4 Minipolisher. Polishing was performed at 2 psi downforce with 230 RPM table speed, 87 RPM Head Speed and with 13 ml/min slurry flow rate with Fujibo H7000 CMP pad.

Table 2 listed the removal rate data (Angstroms/minute) for each of the three wafers used per slurry formulation.

TABLE 2

| Formulation | Wafer 1 (Å/min) | Wafer 2 (Å/min) | Wafer 3 (Å/min) | Average (Å/min) |
|---|---|---|---|---|
| D (Comparative) | 10 | 51 | 116 | 59 |
| E (Comparative) | 41 | 22 | 16 | 26 |
| F | 1093 | 1153 | 1137 | 1127 |

As evidenced from Table 2, Formulation F using CPOP-20 ceria coated silica particles outperformed Formulations D and E.

The results showed that the comparative formulations with alternate particles did not provide necessary removal rates of oxide films on soft pad CMP process. Formulations of this invention provide removal rates which are greatly higher than the comparative formulations thus enabling CMP of oxide films, especially on soft pads.

Example 9

Dispersions of particles in water were tested for the stability under a disintegrative force, that is under ultrasonic disintegration.

The experiment was performed in Branson 2510R-MI Sonic bath with a 100 watt output at 42 KHz. Ceria coated silica CPOP-20 particles as described in example 1 were compared against CP2 particles described in example 9.

TABLE 3

| sample | MPS (nm, DC) | d50 (nm, DC) | d75 (nm, DC) | d99 (nm, DC) |
|---|---|---|---|---|
| CPOP-20 | 97.7 | 94.7 | 114.8 | 172.0 |
| CPOP-20 sonicated 30 min | 96.7 | 94.1 | 114.3 | 171.1 |
| Change % | 1.0% | 0.6% | 0.4% | 0.5% |
| CP2 | 41.1 | 35.7 | 45.0 | 136.4 |
| CP2 sonicated 30 min | 33.6 | 30.4 | 36.7 | 77.0 |
| Change % | 18.2% | 14.8% | 18.4% | 43.5% |

The particle size distribution as measured by Disc Centrifuge method (DC24000 UHR from CPS Instruments) before and after ultrasonication treatments for CPOP-20 and CP2 particles were shown in Table 3 respectively.

The results indicated that the particles used in formulations of this invention did not show change in size distribution, indicating a strong bonding between core and the coated particles.

The change in size distribution of CP2 particles was >14%. Data in Table 3 also showed that the particle size distribution shifting towards smaller particles, indicating that composite particles may not be stable, such as the weak bonding between core and the coated particles.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A polishing composition comprising:
   composite particles comprising core particles with surfaces covered by nanoparticles;
   an additive selected from a compound having a functional group selected from the group consisting of organic carboxylic acids, amino acids, amidocarboxylic acids, N-acylamino acids, and their salts thereof; organic sulfonic acids and salts thereof;
   organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
   a pH-adjusting agent selected from the group consisting of sodium hydroxide, potassium hydroxide, cesium hydroxide, ammonium hydroxide, quaternary organic ammonium hydroxide, and combinations thereof;
   and
   the remaining being water;
   wherein
   the core particle is selected from the group consisting of silica, alumina, titania, zirconia, polymer particle, and combinations thereof; and the nanoparticle is ≥0 nm and is selected from the compounds of a group consisting of zirconium, titanium, iron, manganese, zinc, cerium, yttrium, calcium, magnesium, fluorine, lanthanum, strontium nanoparticle, and combinations thereof;
   change of size distribution of composite particles under a disintegrative force is less than 10%;
   and
   the polishing composition has a pH of about 2 to about 12.

2. The polishing composition of claim 1 wherein the core particle is silica particle, the nanoparticle is ceria nanoparticle, and the composite particles are ceria coated silica composite particles.

3. The polishing composition of claim 2 wherein the composite particles are amorphous silica ceria particles having surfaces covered by singly crystalline ceria nanoparticles.

4. The polishing composition of claim 1 has a pH ranging from 4 to 10; and the change of size distribution of composite particles under a disintegrative force is less than 5%.

5. The polishing composition of claim 1 comprises ceria coated silica composite particles, the additive selected from the group consisting of polyacrylic acid (PAA) or salt, poly(methyl methacrylate) (PMMA), and combinations thereof; ammonium hydroxide; has a pH ranging from 4.5 to 7.5; and the change of size distribution of composite particles under a disintegrative force is less than 2%.

6. The polishing composition of claim 1 further comprises a surfactant selected from the group consisting of a) non-ionic surface wetting agents; b) anionic surface wetting agents; c) cationic surface wetting agents; d) ampholytic surface wetting agents; and mixtures thereof;
and
a biological growth inhibitor selected from the group consisting of tetramethylammonium chloride, tetraethylammonium chloride, tetrapropylammonium chloride, alkylbenzyldimethylammonium chloride with the alkyl chain ranges from 1 to about 20 carbon atoms, alkylbenzyldimethylammonium hydroxide with the alkyl chain ranges from 1 to about 20 carbon atoms, sodium chlorite, sodium hypochlorite, and combinations thereof.

7. A polishing method for chemical mechanical planarization of a semiconductor substrate comprising at least one surface having at least one oxide layer, comprising the steps of:
   a) contacting the at least one oxide layer with a polishing pad;
   b) delivering a polishing composition to the at least one surface, the polishing composition comprising:
      composite particles comprising core particles with surfaces covered by nanoparticles;
      an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
      a pH-adjusting agent selected from the group consisting of sodium hydroxide, potassium hydroxide, cesium hydroxide, ammonium hydroxide, quaternary organic ammonium hydroxide, and combinations thereof;
      and
      the remaining being water;
      wherein
      change of size distribution of composite particles under a disintegrative force is less than 10%;
      the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and
      the polishing composition has a pH of about 2 to about 12;
   and
   c) polishing the at least one oxide layer with the polishing composition.

8. The method of claim 7, wherein the nanoparticle is ceria nanoparticle, the nanoparticle is ceria nanoparticle, and the composite particles are amorphous silica ceria particles having surfaces covered by singly crystalline ceria nanoparticles.

9. The method of claim 7, wherein the polishing composition has a pH ranging from 4 to 10; and the change of size distribution of composite particles under a disintegrative force is less than 5%.

10. The method of claim 7, wherein the polishing composition further comprises
a surfactant selected from the group consisting of a) non-ionic surface wetting agents; b) anionic surface wetting agents; c) cationic surface wetting agents; d) ampholytic surface wetting agents; and mixtures thereof;
and
a biological growth inhibitor selected from the group consisting of tetramethylammonium chloride, tetraethylammonium chloride, tetrapropylammonium chloride, alkylbenzyldimethylammonium chloride with the alkyl chain ranges from 1 to about 20 carbon atoms, alkylbenzyldimethylammonium hydroxide with the alkyl chain ranges from 1 to about 20 carbon atoms, sodium chlorite, sodium hypochlorite, and combinations thereof.

11. The method of claim 7, wherein the polishing composition comprises ceria coated silica composite particles, the additive selected from the group consisting of polyacrylic acid (PAA) or salt, poly(methyl methacrylate) (PMMA), and combinations thereof; ammonium hydroxide; has a pH ranging from 4.5 to 7.5; and the change of size distribution of composite particles under a disintegrative force is less than 2%.

12. The method of claim 7, wherein the at least one oxide layer is a silicon oxide layer.

13. The method of claim 7, wherein the polishing pad is a soft pad.

14. The method of claim 13, wherein polishing removal rate for the at least one oxide layer is equal or greater than 500 A/min.

15. A system for chemical mechanical planarization, comprising:
a semiconductor substrate comprising at least one surface having at least one oxide layer;
a polishing pad; and
a polishing composition comprising:
composite particles comprising core particles with surfaces covered by nanoparticles;
an additive selected from a compound having a functional group selected from the group consisting of organic carboxylic acids, amino acids, amidocarboxylic acids, N-acylamino acids, and their salts thereof; organic sulfonic acids and salts thereof; organic phosphonic acids and salts thereof; polymeric carboxylic acids and salts thereof; polymeric sulfonic acids and salts thereof; polymeric phosphonic acids and salts thereof; arylamines, aminoalcohols, aliphatic amines, heterocyclic amines, hydroxamic acids, substituted phenols, sulfonamides, thiols, polyols having hydroxyl groups, and combinations thereof;
a pH-adjusting agent selected from the group consisting of sodium hydroxide, potassium hydroxide, cesium hydroxide, ammonium hydroxide, quaternary organic ammonium hydroxide, and combinations thereof;
and
the remaining being water;
wherein
change of size distribution of composite particles under a disintegrative force is less than 10%;
the core particle is selected from the group consisting of silica, alumina, titania, zirconia, polymer particle, and combinations thereof; and the nanoparticle is selected from the compounds of a group consisting of zirconium, titanium, iron, manganese, zinc, cerium, yttrium, calcium, magnesium, fluorine, lanthanum, strontium nanoparticle, and combinations thereof; and
the polishing composition has a pH of about 2 to about 12;
and
wherein at least one oxide layer is in contact with the polishing pad and the polishing composition.

16. The system of claim 15, wherein the nanoparticle is ceria nanoparticle, the nanoparticle is ceria nanoparticle, and the composite particles are amorphous silica ceria particles having surfaces covered by singly crystalline ceria nanoparticles.

17. The system of claim 15, wherein the polishing composition has a pH ranging from 4 to 10; and the change of size distribution of composite particles under a disintegrative force is less than 5%.

18. The system of claim 15, wherein the polishing composition further comprises
a surfactant selected from the group consisting of a) non-ionic surface wetting agents; b) anionic surface wetting agents; c) cationic surface wetting agents; d) ampholytic surface wetting agents; and mixtures thereof;
and
a biological growth inhibitor selected from the group consisting of tetramethylammonium chloride, tetraethylammonium chloride, tetrapropylammonium chloride, alkylbenzyldimethylammonium chloride with the alkyl chain ranges from 1 to about 20 carbon atoms, alkylbenzyldimethylammonium hydroxide with the alkyl chain ranges from 1 to about 20 carbon atoms, sodium chlorite, sodium hypochlorite, and combinations thereof.

19. The system of claim 15, wherein the polishing composition comprises ceria coated silica composite particles, the additive selected from the group consisting of polyacrylic acid (PAA) or salt, poly(methyl methacrylate) (PMMA), and combinations thereof; ammonium hydroxide; has a pH ranging from 4.5 to 7.5; and the change of size distribution of composite particles under a disintegrative force is less than 2%.

20. The system of claim 15, wherein the at least one oxide layer is a silicon oxide layer.

21. The system of claim 15, wherein the polishing pad is a soft pad.

* * * * *